United States Patent [19]

Van Hurck et al.

[11] 3,955,147
[45] May 4, 1976

[54] AMPLIFIER CIRCUIT

[75] Inventors: Nicolaas Van Hurck; Dirk Blom, both of Eindhoven, Netherlands

[73] Assignee: U.S., New York, N.Y.

[22] Filed: Apr. 3, 1975

[21] Appl. No.: 564,843

[30] Foreign Application Priority Data

Apr. 25, 1974 Netherlands............... 7405551

[52] U.S. Cl.................................. 330/18; 330/28; 330/30 R; 330/40
[51] Int. Cl.². ........................................ H03F 3/42
[58] Field of Search............... 330/18, 28, 30 R, 40, 330/70, 71

[56] References Cited
UNITED STATES PATENTS
3,424,858  1/1969  Pfyffer et al. ................ 330/30 R X Primary Examiner—James B. Mullins
Attorney, Agent, or Firm—Frank R. Trifari; Henry I. Steckler

[57] ABSTRACT

Low-distortion amplifier comprising n transistors ($n \geq 3$) connected in series for direct currents, $(n-1)$ of these transistors being connected in parallel for alternating currents to ensure low dissipation and a low supply voltage.

2 Claims, 1 Drawing Figure

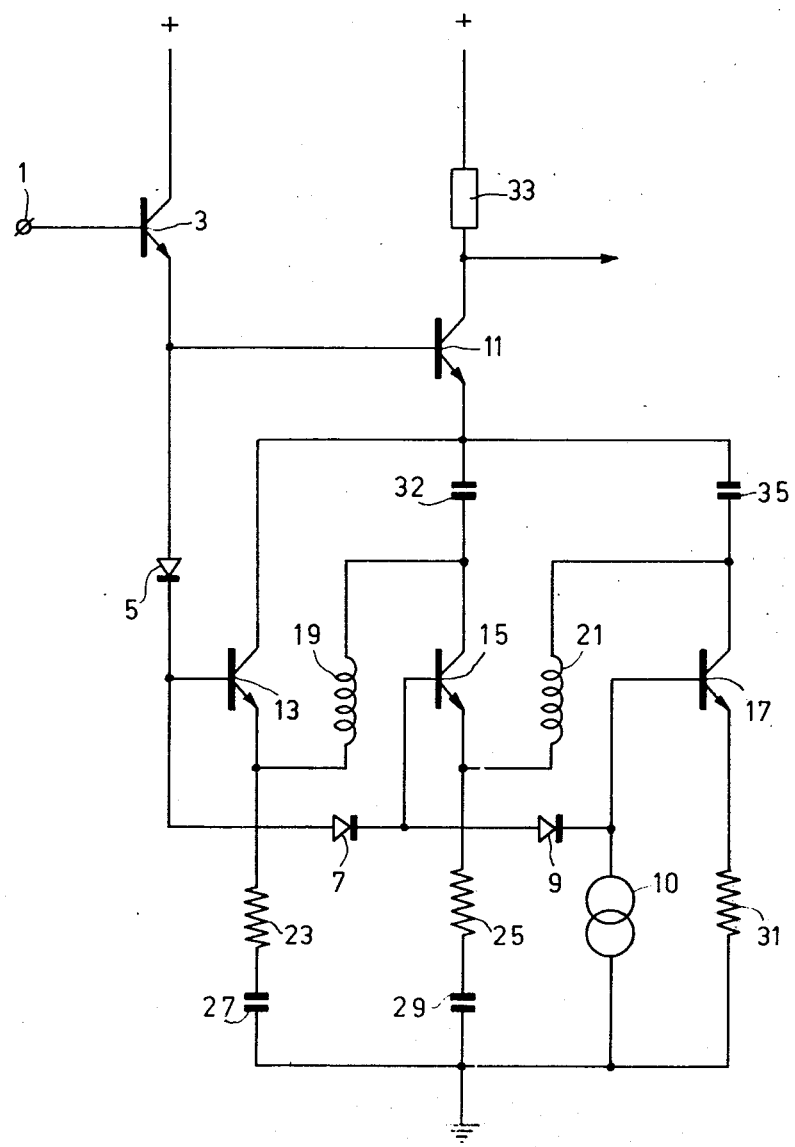

AMPLIFIER CIRCUIT

The invention relates to an amplifier circuit comprising at least three transistors the collector emitter paths of which are connected in series for direct current and which are driven at their bases, the collector circuit of the transistor at one end of the series arrangement of transistors including a load impedance to obtain an output signal.

U.S. Pat. No. 3,274,505 describes an amplifier circuit of the aforementioned type in which the series arrangement is used to enable the circuit to be connected to a high supply voltage. The transistor at the other end of the series arrangement is driven by means of an input signal, the collector circuit of this transistor driven the base of the next transistor, the collector circuit of this next transistor driven the base of the succeeding transistor, and so on. Owing to the high supply voltage a large dissipation occurs which would become extremely high if the current flowing through the transistors should have to be made high in order to obtain small distortion.

It is an object of the present invention to maintain the supply voltage of the series arrangement and the current flowing through it low and to obtain very slight distortion, thereby making the amplifier circuit particularly suitable for use in community aerial systems or cable television systems.

Therefore an amplifier circuit of the aforementioned type is characterized in that the collectors of the transistors other than that the collector circuit of which includes the output impedance are interconnected for alternating voltages, their emitters are each connected through a resistor to a fixed potential for alternating voltages and their bases are connected to one another and to the base of the said transistor at the end of the series arrangement of transistors for alternating voltages.

As a result of the parallel arrangement of all the bases the parallel-connected collectors of the transistors always will have the same alternating voltage applied to them as is applied to the said bases, because the transistor the collector circuit of which includes the output impedance has the same alternating voltage applied to its emitter, to which electrode all the collectors are coupled, as is applied to its base. Hence, even if the transistors, which are connected in parallel for alternating voltages, have a very low supply voltage applied to them, no collector distortion can occur in the emitter circuit of the transistor the collector circuit of which includes the output impedance. Furthermore the distortion in the transistors which are connected in parallel for alternating voltages is small owing to the negative feedback through the emitter resistor of each of these transistors. The signal current flowing through the transistor the collector circuit of which includes the output impedance is large owing to the control by the parallel-connected remaining transistors.

The invention will now be described more fully with reference to the drawing which comprises only a single FIGURE.

The FIGURE illustrates an embodiment, given by way of example, of an amplifier circuit according to the invention.

A signal to be amplified is applied to the input 1 and, via an emitter follower 3 and a direct-voltage divider comprising a series arrangement of three diodes 5, 7 and 9 a current source or a suitably chosen resistor 10, to the bases of four transistors, 11, 13, 15 and 17. The diodes 5, 7 and 9 constitute substantially a short-circuit for alternating voltages.

The transistors 11, 13, 15 and 17 are connected in series for direct voltages. The emitter of the transistor 11 is connected to the collector of the transistor 13, the emitter of the transistor 13 is connected via a choke 19 to the collector of the transistor 15, and the emitter of the transistor 13 is connected via a choke 21 to the collector of the transistor 17. The emitters of the transistors 13 and 15 are connected to earth via negative-feedback resistors 23, 25 and capacitors 27, 29 respectively, which capacitors each are substantially a short-circuit for alternating currents. The emitter of the transistor 17 is connected to earth via a negative-feedback resistor 31. The collectors of the transistors 15 and 17 are connected for alternating currents to the emitter of the transistor 11 via capacitors 32 and 35 respectively.

Thus the transistors 13, 15 and 17 are connected in parallel for alternating currents and in series for direct currents.

The collector of the transistors 11 is connected to a positive supply voltage via a load impedance 33. From this output impedance an output signal of the amplifier can be derived.

The transistors 13, 15 and 17 are controlled at their bases by the same alternating voltage and this alternating voltage is also applied, via the base emitter junction of the transistor 11, to the collectors of the transistors 13, 15 and 17. Consequently there is a constant voltage difference between the collector and the base of each of these transistors, so that no collector distortion occurs. Hence this voltage difference may be maintained very small. In the case under consideration there even is substantially no voltage difference.

The emitter resistors 23, 25 and 31 further provide negative feedback so that the collector currents of the transistors 13, 15 and 17 show extremely small distortion.

The collector alternating currents of the transistors 13, 15 and 17 form the emitter control current of the transistor 11. Hence the collector current of this transistor 11 shows very little distortion and produces an output signal across the load impedance 33 which, with a comparatively small direct current flowing through the series arrangements of transistors, contains few unwanted components.

Owing to this small value of the direct current and the very low direct voltage across the transistors 13, 15 and 17 the dissipation of the circuit is particularly small.

If the number of transistors connected in parallel in the emitter circuit of the transistor 11 is $n$, the emitter resistors 23, 25 and 31 each have a value R and the direct current passed by the transistors is Io, the circuit behaves substantially as a transistor which is controlled by the same input voltage at its base, has an emitter $R/n$ and passes a direct current $nIo$. Such a transistor would require a collector supply voltage about $n$ times that used in the circuits under consideration, so that dissipation would be about $n^2$ times that produced by the circuit according to the invention.

The circuit is particularly suited for use as a wide-band amplifier in community aerial systems or cable television networks.

Instead of coupling the bases of the transistors 11, 13, 15 and 17 via a diode voltage divider a direct-voltage divider comprising resistors shunted by capacitors or another suitable method or coupling may be used.

What is claimed is:

1. Amplifier circuit comprising at least three transistors the collector emitter paths of which are connected in series for direct currents and which are driven at their bases, the collector circuit of the transistor at the end of the series arrangement of transistors including a load impedance for obtaining an output signal, characterized in that of the transistors other than that the collector circuit of which includes the output impedance the collectors are interconnected for alternating voltages, the emitters are each connected through a resistor to a fixed potential for alternating voltages and the bases are connected to one another and to the base of the said transistor at the end of the series arrangement of transistors for alternating voltages.

2. Amplifier circuit as claimed in claim 1, characterized in that the bases of the transistors are connected to one another via a diode voltage divider.

* * * * *

UNITED STATES PATENT AND TRADEMARK OFFICE
CERTIFICATE OF CORRECTION

PATENT NO. : 3,955,147
DATED : May 4, 1976
INVENTOR(S) : NICOLAAS VAN HURCK ET AL

It is certified that error appears in the above–identified patent and that said Letters Patent are hereby corrected as shown below:

<u>ON THE TITLE PAGE</u> cancel "U.S., New York, N.Y." and insert -- U.S. Philips Corporation --;

Signed and Sealed this

Twentieth Day of July 1976

[SEAL]

Attest:

RUTH C. MASON
*Attesting Officer*

C. MARSHALL DANN
*Commissioner of Patents and Trademarks*